(12) United States Patent
Hozumi et al.

(10) Patent No.: US 8,106,447 B2
(45) Date of Patent: Jan. 31, 2012

(54) SEMICONDUCTOR DEVICE AND METHOD OF MANUFACTURING THE SAME

(75) Inventors: Hiroki Hozumi, Kanagawa (JP); Yuji Sasaki, Kanagawa (JP); Shusaku Yanagawa, Kanagawa (JP)

(73) Assignee: Sony Corporation, Tokyo (JP)

( * ) Notice: Subject to any disclaimer, the term of this patent is extended or adjusted under 35 U.S.C. 154(b) by 184 days.

(21) Appl. No.: 12/502,067

(22) Filed: Jul. 13, 2009

(65) Prior Publication Data

US 2010/0032752 A1    Feb. 11, 2010

(30) Foreign Application Priority Data

Aug. 8, 2008   (JP) ................................. 2008-205327

(51) Int. Cl.
  *H01L 29/66*   (2006.01)
(52) U.S. Cl. ......... 257/331; 257/E29.262; 257/E21.158; 257/E21.41; 438/270
(58) Field of Classification Search .................. 257/331, 257/E29.269, E21.158, E21.41; 438/270
See application file for complete search history.

(56) References Cited

U.S. PATENT DOCUMENTS 6,836,001 B2 * 12/2004 Yamauchi et al. ............ 257/627

FOREIGN PATENT DOCUMENTS

| JP | 2000-133801 | 5/2000 |
|---|---|---|
| JP | 2000-260984 | 9/2000 |
| JP | 2004-047967 | 2/2004 |
| JP | 2004-146689 | 5/2004 |
| JP | 2005-183789 | 7/2005 |
| JP | 2006-313892 | 11/2006 |
| JP | 2007-149736 | 6/2007 |
| JP | 2009-295749 | 12/2009 |

* cited by examiner

*Primary Examiner* — Matthew Reames
(74) *Attorney, Agent, or Firm* — Robert J. Depke; Rockey, Depke & Lyons, LLC

(57) ABSTRACT

Disclosed herein is a semiconductor device, including: a first semiconductor region of a first conductivity type; a second semiconductor region having pairs of first pillar regions of the first conductivity type, and second pillar regions of a second conductivity type alternately provided; a third semiconductor region of the second conductivity type; a fourth semiconductor region of the first conductivity type; and control electrodes each provided within a trench through an insulating film, a sidewall of the trench being formed so as to contact each of the third semiconductor region and the fourth semiconductor region.

8 Claims, 7 Drawing Sheets

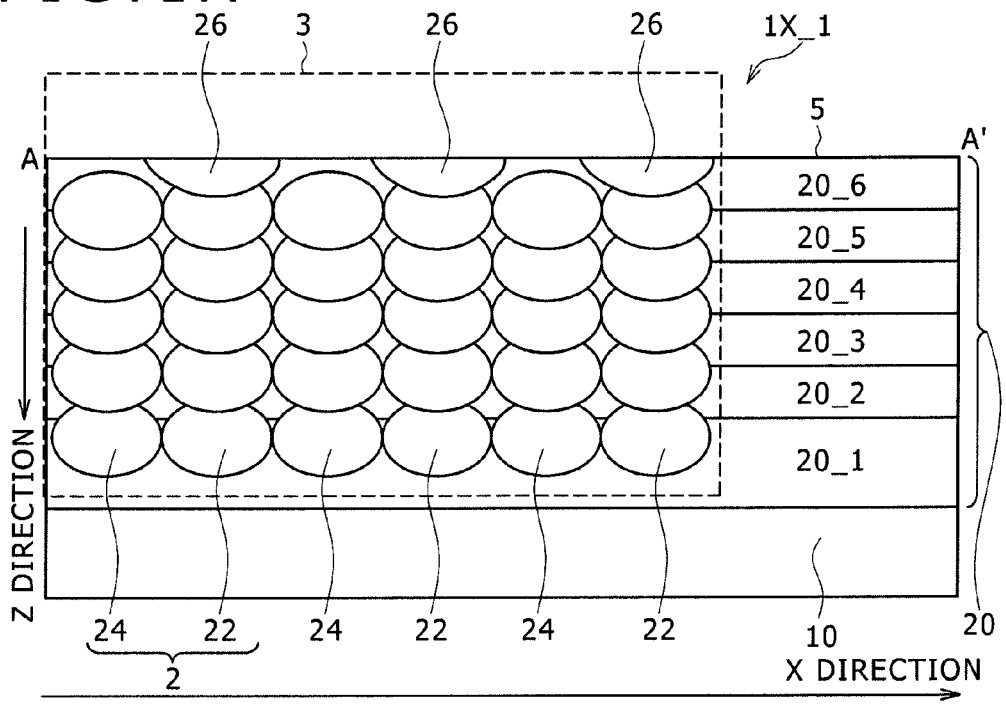
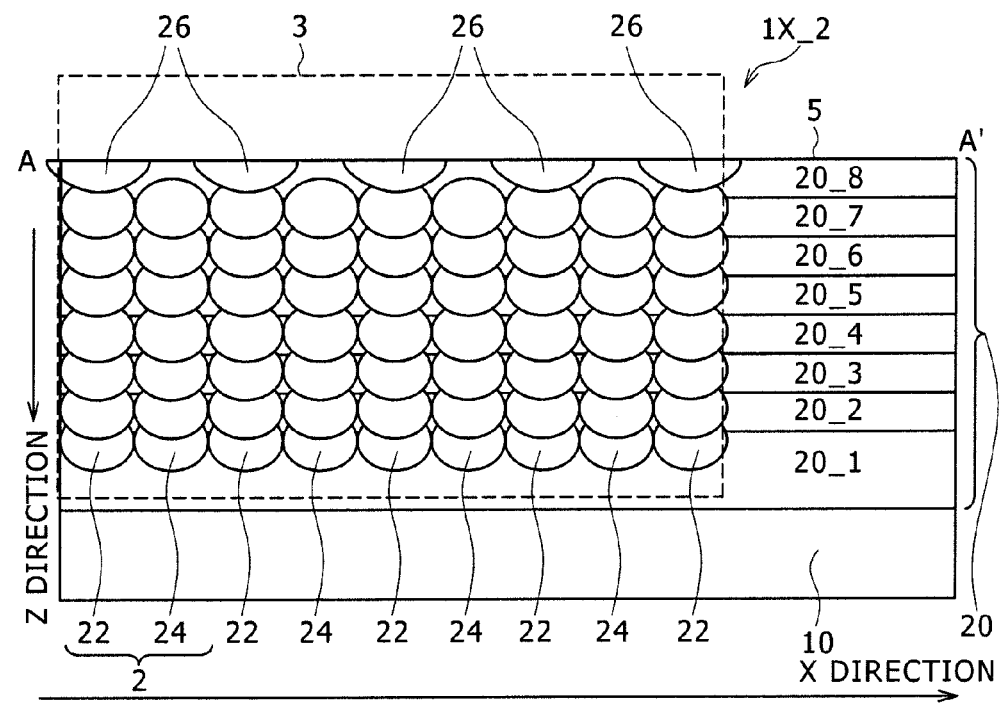

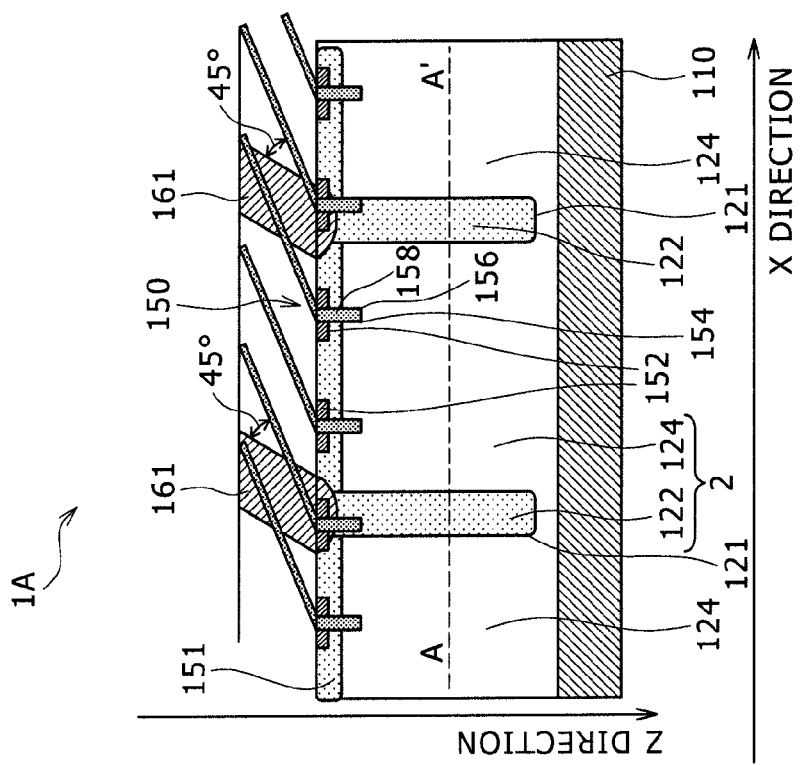
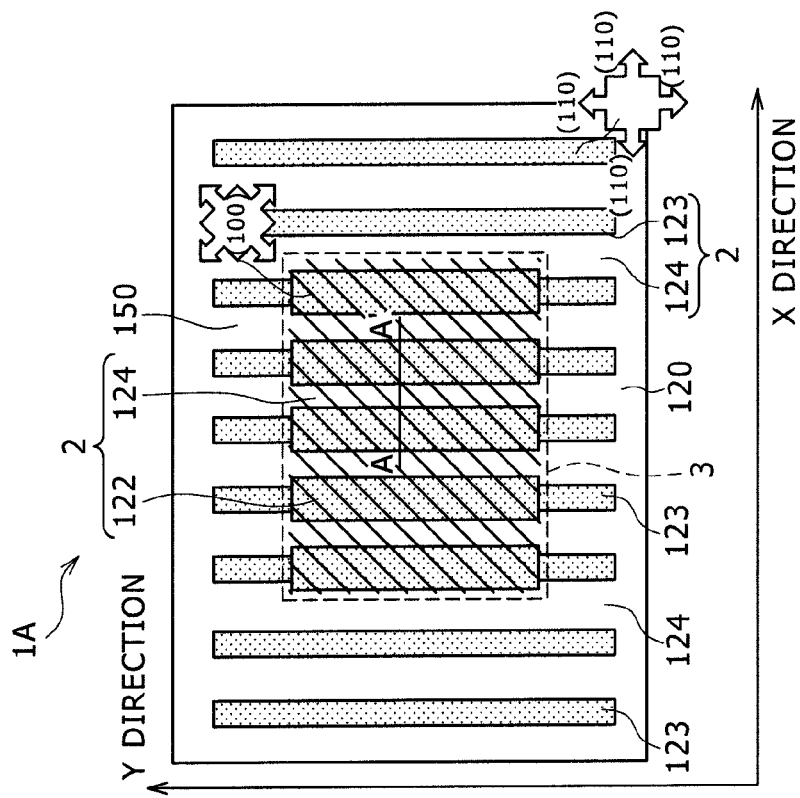

FIG.5A
FIG.5B
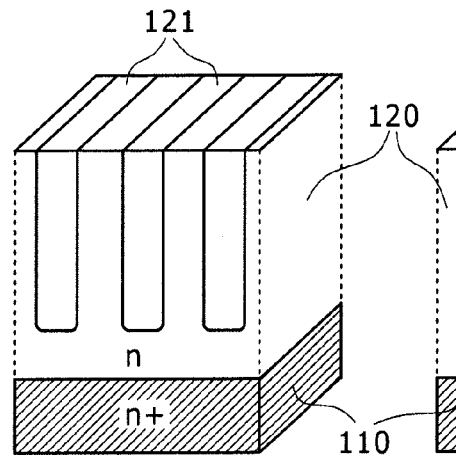
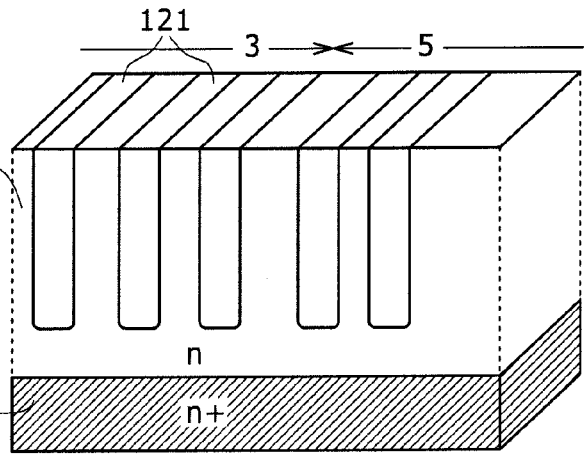
FIG.5C
FIG.5D
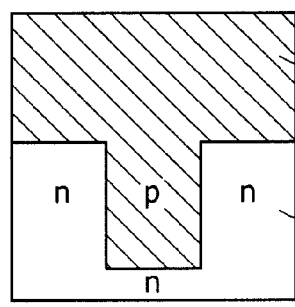
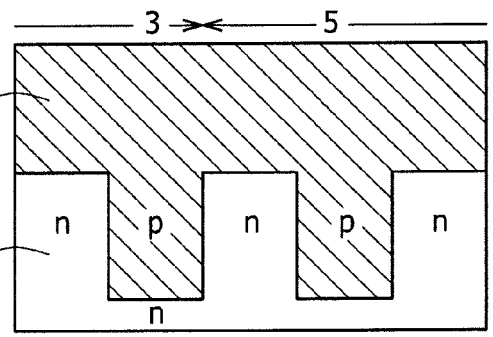
FIG.5E
FIG.5F
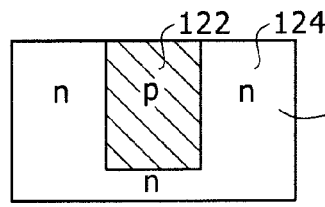
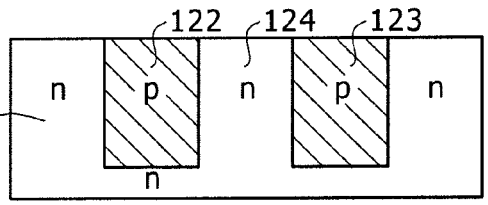

122 124 151 161

122 124 151 161 123 124

122 124 151 161 154

154 122 124 151 161 123 124

SEMICONDUCTOR DEVICE AND METHOD OF MANUFACTURING THE SAME

BACKGROUND OF THE INVENTION

1. Field of the Invention

The present invention relates to a semiconductor device and a method of manufacturing the same, and more particularly to a semiconductor device having a super-junction structure, and a method of manufacturing the same.

2. Description of the Related Art

In recent years, a request for thinning and weight saving for electronic apparatuses has been strong as represented by a liquid crystal television set, a plasma television set, an organic EL (Electro-Luminescence) television set, and the like. Along with the above request, a request for miniaturization and promotion of high performance for power source apparatuses has also been strong. In response to this request, in a power semiconductor element, performance improvements such as high withstand voltage promotion, large current promotion, low loss promotion, high speed promotion and high breaking withstand voltage promotion have attracted attention. For example, a vertical power MOSFET (Metal-Oxide Semiconductor Field-Effect Transistor) is known as a switching element for a power electronics application.

Each of an ON resistance and a withstand voltage of a MOSFET largely depends on an impurity concentration of an N-type region as a conductive layer of the MOSFET. Although the impurity concentration of the conductive layer is increased for the purpose of reducing the ON resistance, in order to ensure a desired withstand voltage, it is difficult to increase the impurity concentration to some value or more. That is to say, a semiconductor region of a MOSFET through which a source region and a drain region are connected to each other is generally called a drift region (drift layer). In a phase of an ON state of the MOSFET, the drift region becomes a current path, while in a phase of an OFF state of the MOSFET, a withstand voltage of the MOSFET is held based on a depletion layer extending from a pn junction formed by the drift region and a base region.

The ON resistance of the MOSFET depends on an electrical resistance of a conductive layer (drift region). For realization of the low ON resistance, it is expected that an impurity concentration of the drift region is increased to reduce the electrical resistance of the drift region. However, increasing the impurity concentration of the drift region results in that the extension of the depletion layer becomes insufficient, and thus the withstand voltage is reduced. That is to say, although increasing the impurity concentration of the drift region allows the ON resistance to be reduced, there is a limit to increasing the impurity concentration for the purpose of ensuring the desired withstand voltage. As has been described, in the MOSFET, the promotion of the low ON resistance, and the promotion of the high withstand voltage show a trade-off relationship. Thus, improving the trade-off relationship is required for the low power consumption element.

A technique referred to as a MULTI-RESURF structure or a super-junction structure (hereinafter typically referred to as "a super-junction structure") is known as one technique for breaking through the trade-off. This technique, for example, is described in Japanese Patent Laid-Open Nos. 2004-146689, 2006-313892 and 2007-149736, and Japanese Patent Nos. 3940518 and 3943732 (hereinafter referred to as Patent Documents 1 to 5, respectively).

As described in Patent Documents 1 to 5, a MOSFET including a drift region having a super-junction structure has a structure in which p-type pillar-like semiconductor regions (a P-type region, a p-type pillar region, and a p-type vertical resurf layer), and n-type pillar-like semiconductor regions (an N-type region, an n-type pillar region, and an n-type vertical resurf layer) are disposed periodically, alternately, or in island-like shapes in a direction parallel with a surface of a semiconductor substrate. In other words, the MOSFET concerned has a vertical resurf structure in which the p-type pillar region and the n-type pillar region are alternately, transversely and repetitively disposed within the semiconductor layers disposed so as to hold a source electrode and a drain electrode between the semiconductor layers.

The withstand voltage is held based on a depletion layer extending from a pn junction formed by these semiconductor regions. Even when the extension of the depletion layer becomes small by increasing an impurity concentration for the low ON resistance, each of the widths of these semiconductor regions is made small, which results in that the complete depletion of these semiconductor regions becomes possible. In an ON state, a current is caused to flow through the N-type region of the conductive layer, while in an OFF state, each of the P-type region and the N-type region is completely depleted, thereby making it possible to ensure the withstand voltage. As a result, the promotion of the low ON resistance, and the promotion of the high withstand voltage in the MOSFET can be simultaneously attained.

As has been described, the super-junction structure depends on the width of each of the p-type semiconductor regions, and the width of each of the n-type semiconductor regions between each two p-type semiconductor regions. When each of the widths of the p-type semiconductor region and the n-type semiconductor region is further narrowed, the impurity concentration of the n-type semiconductor region can be further increased. As a result, it is possible to attain the further reduction of the ON resistance, and the promotion of the higher withstand voltage. As can be seen from this, the impurity concentration becomes the point based on which the withstand voltage and the ON resistance are determined.

Therefore, with regard to the preferred form, for the purpose of further increasing the withstand voltage, it becomes important to strike the balance between the impurity of the p-type semiconductor region, and the impurity of the n-type semiconductor region, that is, the so-called charge balance. That is to say, an amount of impurity contained in the p-type semiconductor region, and an amount of impurity contained in the n-type semiconductor region are equalized to each other, whereby the impurity concentration becomes equivalently zero, thereby making it possible to obtain the high withstand voltage. In a phase of reverse bias (in a phase of the OFF state), the complete depletion is realized to hold the high withstand voltage, whereas in a phase of zero bias (in a phase of the ON state), a current is caused to flow through the n-type semiconductor region heavily doped with an n-type impurity, thereby realizing an element having a low ON resistance beyond the material limit.

The low ON resistance element having the super-junction structure greatly contributes to the promotion of the low power consumption in the circuit. However, for the design of the ON resistance, it becomes important to strike the right balance among a resistance of the super-junction structure portion, the ON resistance of the switching transistor, other parasitic resistances, and the like. In the case of a combination with a planar type MOSFET having a channel in a silicon surface, it is necessary to narrow a transverse period of the super-junction structure for the purpose of improving the trade-off between the withstand voltage and the ON resistance by using the super-junction structure. In addition, it is necessary to narrow a transverse period (cell pitch) as well of the MOS gate structure for the purpose of reducing the ON resistance of the entire element.

For this reason, in recent years, a vertical MOSFET having a MOS gate structure as a trench gate structure has been used on a middle or low withstand voltage application instead of using the combination with the planar type MOSFET. The vertical MOSFET has a structure in which a gate insulating film is formed on an inner wall of a relatively shallow trench formed in a base region, and a gate electrode is formed so as to be filled in the trench. In the case of the vertical MOSFET, the high integration can be made for the transistor pitches, which results in that a large effective gate width can be obtained in the same semiconductor area. Thus, the vertical MOSFET is suited to the low ON resistance.

On the other hand, the following three techniques are expected as a method of manufacturing the super-junction structure.

(1) An n-type impurity and a p-type impurity are separately introduced into an epitaxial layer (made of epitaxial silicon) by utilizing an ion implantation method, and the epitaxial structure is repetitively formed multiple times so that the epitaxial structures are laminated in order, thereby manufacturing the super-junction structure (referred to as "a first manufacturing method"). That is to say, the first manufacturing method is a multi-epitaxial manufacturing method in which the same epitaxial growth is repetitively carried out multiple times.

(2) A trench is formed in a thick epitaxial layer, an impurity is introduced into the side surface of the trench by utilizing a diffusion method or the like, and an insulating material or a non-conductive material is filled in the trench (referred to as "a second manufacturing method").

(3) A trench is formed in a thick epitaxial layer, and silicon containing therein an impurity is filled in the trench in an epitaxial growth process (referred to as "a third manufacturing method"). That is to say, the third manufacturing method is a manufacturing method in which the trench formed once is back-filled with silicon containing therein the impurity in the epitaxial growth process (trench forming epitaxial back-filling manufacturing method).

Moreover, when the vertical MOSFET is adopted as a switching transistor combined with the super-junction structure, how the manufacturing method of the super-junction structures shown in items (1) to (3), and the formation of the relative shallow trench are combined with each other becomes important.

For example, the super-junction structure has become effective in the promotion of the low ON resistance and the chip shrink. However, the optimal sizes exist in an arrangement pitch P1 of pn junctions composing the super-junction structure, and a gate pitch P2 of switching transistors, respectively. Thus, it cannot be said that fulfilling both the arrangement pitch P1 and the gate pitch P2 is usually possible.

The arrangement pitch P1 of the pn junctions is constrained by the deep trench formation and the impurity diffusion. Also, whether the transistor is of the planar type or of the vertical type, the shallow trench technique, the optimization of the gate-to-drain capacitor Qgd, the manufacture process line generation, and the like exert an influence on the gate pitch P2.

For example, there is proposed a case example in which the gate pitch of the vertical transistor is set together with the pitch of the super-junction structure as in the case of the structure described in Patent Document 2, or a case example in which the gate pitch of the vertical transistor is doubled as in the case of the structure described in Patent Document 3.

In addition, there is also proposed a case example in which the arrangement directions of the super-junction structure and the vertical transistor structure are made to perpendicularly intersect with each other, thereby dissolving the restriction condition of the mutual pitches as in the case of the structures described in Patent Documents 4 and 5.

SUMMARY OF THE INVENTION

However, with any of the structures described in Patent Documents 2 and 3, the repetitive pitch of the vertical transistor is forced to be consistent with the pn junction pitch of the super-junction structure, which becomes the restriction condition for the optimization of the promotion of the low ON resistance. Thus, it may be impossible to properly draw both the performances. For example, in general, the arrangement pitch P1 of the pn junction is in the range of several tens of micrometers to ten micrometers, and the gate pitch P2 is in the range of ten micrometers to 3 micrometers. Thus, the gate pitch P2 is finer than the arrangement pitch P1 of the pn junctions. However, with any of the structures described in Patent Documents 2 and 3, the gate pitch P2 is compelled to be adjusted to the arrangement pitch P1 of the pn junctions.

Although with any of the structures described in Patent Documents 4 and 5, the restriction condition of the mutual pitches is dissolved, the optimization of the transistor pitch is not mentioned.

The present invention has been made in the light of the circumstances described above, and it is therefore desirable to provide a semiconductor device, having a super-junction structure, which can be formed in a simple process, and in which both performances of the super-junction structure and a vertical switching device can be properly drawn without being influenced by the other arrangement pitch, and a method of manufacturing the same.

In order to attain the desire described above, according to an embodiment of the present invention, there is provided a semiconductor device including: a first semiconductor region of a first conductivity type disposed on a side of a first electrode; a second semiconductor region having pairs of first pillar regions of the first conductivity type, and second pillar regions of a second conductivity type alternately provided along a surface on a side of a second electrode disposed on a side opposite to the first electrode of the first semiconductor region; a third semiconductor region of the second conductivity type formed on a surface portion on a side of the second electrode of the second semiconductor region; a fourth semiconductor region of the first conductivity type formed on a part of a surface of the third semiconductor region so as to be connected to the second electrode; and control electrodes each provided within a trench through an insulating film, a sidewall of the trench being formed so as to contact each of the third semiconductor region and the fourth semiconductor region. In the semiconductor device, the second pillar regions are formed by filling a semiconductor of the second conductivity type in each of the trenches formed in the second semiconductor region through epitaxial growth, and are arranged in stripe shapes in the same direction in an element portion having the third semiconductor region and the fourth semiconductor region disposed therein; the first pillar regions are formed as regions each held between each two second pillar regions; and the control electrodes are arranged in stripe shapes so as to perpendicularly intersect at an angle of 45° with a longitudinal direction of the stripes of the second pillar regions.

According to another embodiment of the present invention, there is provided a semiconductor device including: a first semiconductor region of a first conductivity type disposed on a side of a first electrode; a second semiconductor region having pairs of first pillar regions of the first conductivity type, and second pillar regions of a second conductivity type alternately provided along a surface on a side of a second electrode disposed on a side opposite to the first electrode of the first semiconductor region; a third semiconductor region of the second conductivity type formed on a surface portion on a side of the second electrode of the second semiconductor region; a fourth semiconductor region of the first conductivity type formed on a part of a surface of the third semiconductor region so as to be connected to the second electrode; and control electrodes each provided within a trench through an insulating film, a sidewall of the trench being formed so as to contact each of the third semiconductor region and the fourth semiconductor region. In the semiconductor device, the second pillar regions are formed by filling a semiconductor of the second conductivity type in each of the trenches formed in the second semiconductor region through epitaxial growth, and are arranged in stripe shapes in the same direction in an element portion having the third semiconductor region and the fourth semiconductor region disposed therein; the first pillar regions are formed as regions each held between each two second pillar regions; each of the trenches composing the second pillar regions is formed so that a (110) plain orientation appears in a sidewall of each of the trenches; and each of the trenches composing the control electrodes is formed so that a (100) plain orientation appears in a sidewall of each of the trenches.

According to still another embodiment of the present invention, there is provided a semiconductor device including: a first semiconductor region of a first conductivity type disposed on a side of a first electrode; a second semiconductor region having pairs of first pillar regions of the first conductivity type, and second pillar regions of a second conductivity type alternately provided along a surface on a side of a second electrode disposed on a side opposite to the first electrode of the first semiconductor region; a third semiconductor region of the second conductivity type formed on a surface portion on a side of the second electrode of the second semiconductor region; a fourth semiconductor region of the first conductivity type formed on a part of a surface of the third semiconductor region so as to be connected to the second electrode; and control electrodes each provided within a trench through an insulating film, a sidewall of the trench being formed so as to contact each of the third semiconductor region and the fourth semiconductor region, In the semiconductor device, the second pillar regions are formed by filling a semiconductor of the second conductivity type in each of the trenches formed in the second semiconductor region through epitaxial growth, and are arranged in stripe shapes in the same direction in an element portion having the third semiconductor region and the fourth semiconductor region disposed therein; the first pillar regions are formed as regions each held between each two second pillar regions; the control electrodes are arranged in stripe shapes so as to intersect with the stripe shapes of the second pillar regions; and a crystal plain orientation appearing in a sidewall of each of the trenches composing the control electrodes are a crystal plain orientation which is higher in carrier mobility when an impurity is implanted than a crystal plain orientation appearing in sidewall of each of the trenches composing the second pillar regions.

According to yet another embodiment of the present invention, there is provided a method of manufacturing a semiconductor device including the steps of: forming a second semiconductor region of a first conductivity type on a first semiconductor region of the first conductivity type; forming first trenches having the same depth and the same shape in the same direction in the second semiconductor region, thereby forming first pillar regions of the first conductivity type; filling a semiconductor of a second conductivity type in each of the trenches through epitaxial growth, thereby forming second pillar regions of the second conductivity type; forming a third semiconductor region of the second conductivity type on a surface portion on a side of a second electrode of the second semiconductor region; forming a fourth semiconductor region of the first conductivity type on a part of a surface of the third semiconductor region; and forming second trenches having the same depth and the same shape in the same direction so that sidewalls of the second trenches contact each of the third semiconductor region and the fourth semiconductor region, forming an insulating film on each of the sidewalls of the second trenches, and filling an electrode member in each of the second trenches, thereby forming control electrodes. In the semiconductor device manufacturing method, in the step of forming the first trenches and in the step of forming the second trenches, the control electrodes are arranged in stripe shapes so as to intersect with the stripe shapes of the second pillar regions; and setting is carried out such that a crystal plain orientation appearing in each of the sidewalls of the second trenches become crystal plain orientation which is higher in carrier mobility when an impurity is implanted than a crystal plain orientation appearing in each of the sidewalls of the first trenches.

When the arrangement pitch of the control electrodes of the vertical switching device is not restricted by the arrangement pitch of the pn pillar pairs having the super-junction structure, the vertical switching device can be manufactured in accordance with a miniaturization optimal rule for the process. Also, the arrangement pitch of the pn pillar pairs can be optimized from the aspect of the ON resistance and the withstand voltage. The crystal plain orientation allowing the carrier mobility characteristics to be improved is made to appear in each of the sidewalls of the trenches for the control electrodes, thereby making it possible to optimize the characteristics of the vertical switching device.

According to the present invention, since the super-junction structure having the pn pillar pairs formed therein is obtained by the formation of the trenches, and the filling of the trenches through the epitaxial growth, the semiconductor device can be formed in the simple process. In addition thereto, the transistor pitch can be narrowed and the carrier mobility characteristics of the vertical switching device are improved without being influenced by the other arrangement pitch. As a result, both the ON resistance performance and the withstand voltage performance of the super-junction structure, and the switching characteristics of the vertical switching device can be properly, satisfactorily drawn.

BRIEF DESCRIPTION OF THE DRAWINGS

FIGS. 1A and 1B are respectively cross sectional views showing schematic structures of semiconductor devices of a first comparative example;

FIGS. 3A and 3B are respectively a top plan view and a bird's eye view each showing a structure of a semiconductor device according to a first embodiment of the present invention;

FIGS. 5A and 5B, FIGS. 5C and 5D and FIGS. 5E to 5N are respectively bird's eye views, cross sectional views and bird's eye views explaining a method of manufacturing the semiconductor device according to the first embodiment of the present invention.

DETAILED DESCRIPTION OF THE PREFERRED EMBODIMENTS

The preferred embodiments of the present invention will be described in detail hereinafter with reference to the accompanying drawings. When functional elements are distinguished from one another in the embodiments, the description is given by adding reference symbols of large letters such as A, B, . . . to the functional elements. On the other hand, when a description is given especially without distinction, the description is given with such reference symbols being omitted. This also applies to the drawings.

In addition, so long as there is especially no notice, the following description is given under the condition that silicon Si is used as a base material, a first conductivity type is an n-type, and a second conductivity type is a p-type. In addition, "n−," "n," "n+," and "p−," "p," "p+" are used for representing a concentration of an n-type, and a concentration of a p-type, respectively. When "n" is used as a reference of the concentration, "n+" represents that the concentration of the n-type impurity is high, and "n−" represents that the concentration of the n-type impurity is low. This also applies to the p-type. As the number of "−" or "+" is more, the tendency thereof is relatively strong.

COMPARATIVE EXAMPLES

Figures 2A, 2B:
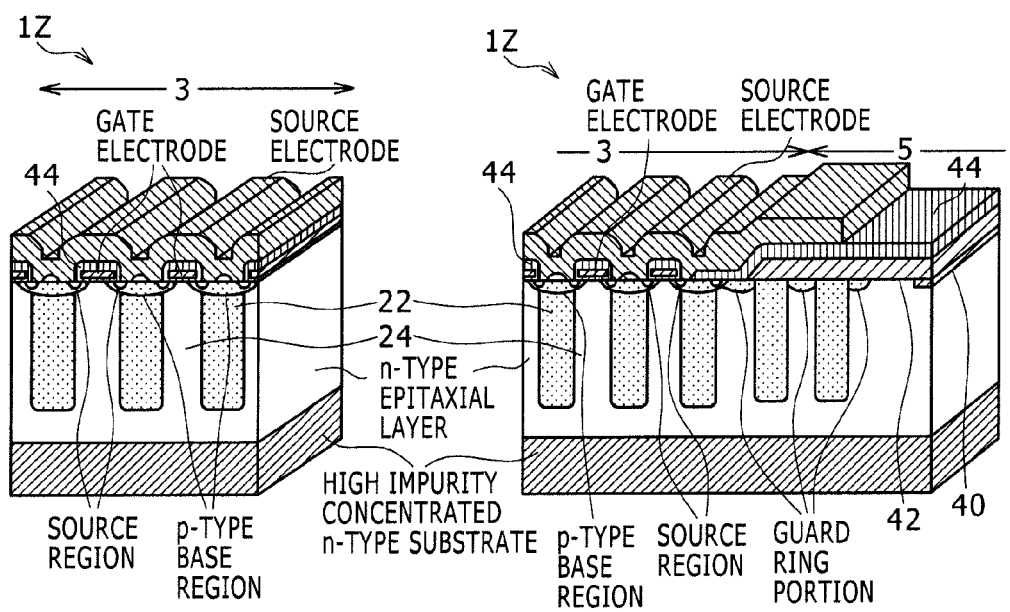
FIGS. 2A and 2B are respectively bird's eye views showing a schematic structure of a semiconductor device of a second comparative example.

FIGS. 1A and 1B, and FIGS. 2A and 2B are respectively views showing comparative examples of a semiconductor device according to a first or second embodiment of the present invention. Here, FIGS. 1A and 1B are respectively cross sectional views showing a schematic structure of a semiconductor device 1X of a first comparative example. Also, FIGS. 2A and 2B are respectively bird's eye views showing a schematic structure of a semiconductor device 1Z of a second comparative example.

The semiconductor device 1X is a vertical power MOSFET having a structure in which a large number of element cells having a parallel pn structure are disposed in parallel with one another. As shown in FIGS. 1A and 1B, the semiconductor device 1X includes n-type epitaxial layers 20 (20_1 to 20_6), each lower in impurity concentration than a high impurity concentrated n-type substrate 10, which are arranged at predetermined pitches on a surface of the high impurity concentrated n-type substrate 10 (an n+-type drain layer) as an example of a semiconductor layer of a first conductivity type having a relatively high impurity concentration. The pitches are set as being approximately identical to one another except for a lowermost layer (the high impurity concentrated n-type substrate 10 side).

The n-type epitaxial layer 20 is divided into an element portion 3 (a super-junction element region), and a termination portion 5 (peripheral structure region). Here, an element cell 2 having the parallel pn structure composed of a pair of p-type semiconductor region (p-type pillar region) and n-type semiconductor region (n-type pillar region) is provided in the element portion 3. Also, the termination portion 5 is provided so as to surround the element portion 3. In the element portion 3, p-type pillar diffusion layers 22 (p-type drift layers), and n-type pillar diffusion layers 24 (n-type drift layers) are formed at predetermined pitches (each identical to the pitch of the n-type epitaxial layer 20 (20_1 to 20_6)), respectively, in the n-type epitaxial layer 20. The super-junction structure is formed by the p-type pillar diffusion layer 22, and the n-type pillar diffusion layer 24 held between each two p-type pillar diffusion layers 22. The p-type pillar diffusion layer 22, and the n-type pillar diffusion layer 24 are formed in stripe shapes, respectively, so as to extend in a direction vertical to the plane of the paper. P-type base regions 26 are selectively formed in the vicinity of a surface, of the p-type pillar diffusion layers 22, on a side opposite to the high impurity concentrated n-type substrate 10 side so as to be connected to the p-type pillar diffusion layers 22, respectively.

With regard to an example of a size of each of the p-type pillar diffusion layers 22 and the n-type pillar diffusion layers 24, when a breakdown voltage (i.e., the withstand voltage) is Vb, a depth (thickness) of each of the p-type pillar diffusion layer 22 and the n-type pillar diffusion layer 24 is D $(=\alpha \cdot Vb^{\wedge}1.2:$ e.g., $\alpha=0.024)[\mu m]$, a width there of is $W[\mu m]$, and an impurity concentration is C, a relationship of $C\approx7.2\times10^{\wedge}16\cdot Vb^{\wedge}(-0.2)/b\,[cm-3]$ is fulfilled. That is to say, the depth D and the width W of each of the p-type pillar diffusion layer 22 and the n-type pillar diffusion layer 24 depend on the withstand voltage (=breakdown voltage Vb) and the impurity concentration C. When the breakdown voltage of about 500 to about 800 V is required, the width W is set in the range of 1 to 10 μm, and the depth D is set in the range of about 30 to about 80 μm. Also, the impurity concentration C is set in correspondence thereto. As can be seen from this as well, each of the p-type pillar diffusion layer 22 and the n-type pillar diffusion layer 24 is narrow in width W, and deep in depth D (that is, an aspect ratio is large).

Although not illustrated, a drain electrode (first main electrode) electrically connected to the high impurity concentrated n-type substrate 10 is formed on a surface of the high impurity concentrated n-type substrate 10 on a side opposite to the n-type epitaxial layer 20. In addition, a contact region and an n+-type source region each contacting a source electrode are formed on a surface portion of the p-type base region 26. The source electrode (second main electrode) is formed so as to contact each of the surfaces of the n+-type source region and the p-type base region 26. In addition, a gate electrode (control electrode) is formed on the surface of the n-type pillar diffusion layer 24 held between the adjacent p-type base regions 26, and the surface of each of the adjacent p-type base regions 26 and n+-type source region on the same surface side as that of the source electrode of the n-type epitaxial layer 20 through a gate insulating film so as to be surrounded by the source electrode. The p-type base region 26, the n+-type source region, the source electrode, and the gate electrode are also formed in stripe shapes in the same direction as that of each of the p-type pillar diffusion layer 22 and the n-type pillar diffusion layer 24. With such a structure, the semiconductor device 1X composes an n-channel MOSFET for electron injection having the surface portion of the p-type base region 26 right under the gate insulating film as a channel region.

Here, in a vertical power MOSFET having a super-junction structure, it is important to suitable design a structure of a region in which a semiconductor device actively operates (corresponding to the element portion 3 of the semiconductor device 1X), and a structure in an element peripheral portion (corresponding to the termination portion 5 of the semiconductor device 1X). In particular, it is required for the termination portion 5 to ensure the withstand voltage as being equal to or higher than that in the element portion 3. That is to say, the withstand voltage characteristics of the termination portion 5 can become a primary factor for determining the vertical power MOSFET device characteristics.

In the termination portion 5, when the p-type pillar region (corresponding to the p-type pillar diffusion layer 22 of the semiconductor device 1X), and the n-type pillar region (corresponding to the n-type pillar diffusion layer 24 of the semiconductor device 1X) are each completely depleted in a state in which a suitable voltage is applied to the drain electrode in an OFF state, the withstand voltage is determined depending on a thickness of the depletion layer in a longitudinal direction. Therefore, the ON resistance can be reduced by increasing the impurity concentration of the n-type pillar region. However, it is important for the termination portion 5 to ensure the withstand voltage for which the transverse extension of the depletion layer in the OFF state is taken into consideration. Moreover, it is also important to make a device for preventing an electric field from reaching a critical electric field in the depletion layer extending in the transverse direction.

In other words, in a semiconductor device for a power application, including a switching MOSFET element for a power application, the multi-resurf structure or the super-junction structure in which a P-type region and an N-type region are alternately, repetitively disposed, and are completely depleted in a phase of reverse bias for ensuring a high withstand voltage, for example, equal to or higher than 500 V. A combination of this technique with the MOSFET results in that the low ON resistance and the promotion of the high withstand voltage of the switching element are simultaneously realized.

Now, the following three techniques are expected as a method of manufacturing the super-junction structure.

(1) A first manufacturing method in which an n-type impurity and a p-type impurity are separately introduced into an epitaxial layer (made of epitaxial silicon) by utilizing an ion implantation method, and the epitaxial structure is repetitively formed multiple times so that the epitaxial structures are laminated in order, thereby manufacturing the super-junction structure (multi-epitaxial manufacturing method).

(2) A second manufacturing method in which a trench is formed in a thick epitaxial layer, an impurity is introduced into the side surface of the trench by utilizing a diffusion method or the like, and an insulating material or a non-conductive material is filled in the trench.

(3) A third manufacturing method in which a trench is formed in a thick epitaxial layer, and silicon containing therein an impurity is filled in the trench in an epitaxial growth process (trench forming epitaxial back-filling manufacturing method).

Although for realization of these manufacturing methods, various problems exist, in particular, the following is described now. Firstly, the first manufacturing method is applied to the manufacture of the semiconductor device 1X. The n-type epitaxial layer 20 having the high resistance is grown on the wafer surface (the high impurity concentrated n-type substrate 10) to have a thickness of about 10 μm, and the p-type semiconductor region and the n-type semiconductor region are formed by utilizing the ion implantation method. After that, the n-type epitaxial layer (the n-type epitaxial layer 20) having the high resistance is grown, and the p-type semiconductor region and the n-type semiconductor region are formed. Such steps are repeated about five to about ten times, thereby forming the p-type pillar diffusion layer 22 and the n-type pillar diffusion layers 24. For example, the n-type epitaxial layer 20 is formed in multiple epitaxial growths (for example, in six epitaxial growths in a semiconductor device 1X_1 shown in FIG. 1A). The six epitaxial layers 20_1 to 20_6 which are formed in respective growth processes are laminated in order, thereby forming the n-type epitaxial layer 20. The p-type pillar diffusion layer 22 and the n-type pillar diffusion layer 24 are formed by coupling a plurality of diffusion layers 22_1 to 22_6 to one another, and coupling a plurality of diffusion layers 24_1 to 24_6 to one another, which are formed by utilizing the ion plantation and diffusion, in a depth direction.

For this reason, with the first manufacturing method called the multi-epitaxial manufacturing method as well, it is possible to form the n-type semiconductor region and the p-type semiconductor region different in profile from each other in the element portion 3 and the termination portion 5. The feature of the first manufacturing method is that the first manufacturing method is relatively, readily realized, and the device is made for amounts of impurities introduced into the laminated layers, and the pattern, thereby controlling the impurity profile in the element portion 3 and the termination portion 5 at will.

However, the p-type pillar diffusion layer 22 and the n-type pillar diffusion layer 24 are alternately disposed to the depth of about 40 to about 80 μm from the silicon surface. As a result, the structure is complicated, and the number of processes such as the number of times of the ion implantation or the number of times of the lamination for the epitaxial growth is relatively large, and thus the manufacturing process becomes complicated. Moreover, due to the necessary and sufficient diffusion temperature and time required for connection of the p-type pillar diffusion layer 22 and the n-type pillar diffusion layer 24 in the longitudinal direction, the transverse diffusion cannot be ignored. Thus, the further device is required for the relative miniaturization. Conversely, when the temperature and time are tried to be shortened, it is necessary to thin the thickness of the epitaxial layer per one time. This corresponds to an increase in number of times of the repetitive lamination of the epitaxial layers. Therefore, as shown in FIG. 1B, this leads to a further increase in number of processes described above (eight times in a semiconductor device 1X_2 in FIG. 1B). That is to say, the reduction in chip size, and the reduction in wafer cost show the trade-off relationship.

With regard to the second manufacturing method, the material selection is important for an insulating material to be filled. Thus, it is necessary to care the insulating breakdown voltage of the selected material, and the interface with silicon (Si) as the base material. Moreover, a difference in coefficient of thermal expansion between the filled insulating material and silicon (Si) exerts an influence on generation of a crystal defect which may be generated due to the future heat treatment, and thus the preventive measures need to be taken for the coefficient of thermal expansion.

On the other hand, in the semiconductor device 1X, when the element cell 2 having the parallel pn structure is intended to be formed, it is also expected to apply the third manufacturing method. In this case, an n-type epitaxial layer is grown on a wafer substrate to have a thickness of 40 to 80 μm, and a pattern is then formed in a stripe shape. Also, the n-type epitaxial layer is etched into a trench shape, thereby forming the trench approximately equal in depth to or slightly shallower than the n-type epitaxial layer (for example, having the depth in the range of about 30 to about 70 μm). After that, the p-type semiconductor is back-filled in the trench through the epitaxial growth process. With such a third manufacturing method, there is the possibility that it is possible to realize the super-junction structure having the high integration in spite of the less number of processes.

However, the third manufacturing method involves a problem in the condition under which a defect is prevented from being generated during the epitaxial growth to the trench, and in the control for an amount of doping impurity. In particular, since differences occur in the epitaxial speed and the impurity concentration due to a crystal plain orientation appearing during formation of the trench, it is important to control the epitaxial speed and the impurity concentration with the high accuracy, and to obtain the productive condition free from any of the defects.

In addition, when the vertical MOSFET is adopted as the switching transistor intended to be combined with the super-junction structure, how the manufacture of the super-junction structure shown in the items (1) to (3) described above, and the formation of the relative shallow trench are combined with each other may become a problem. The reason for this is because the arrangement pitch P1 of the pn junctions composing the super-junction structure is constrained by the deep trench formation and the impurity diffusion, while the gate pitch P2 of the vertical MOSFETs is influenced by the shallow trench forming technique, the optimization of the gate-to-drain capacitor Qgd, the manufacture process generation or the like. For this reason, the optimal sizes exist in the arrangement pitch P1 of the pn junctions, and the gate pitch P2, respectively, and thus the various measures to be taken are considered. However, these existing techniques do not necessarily, simultaneously fulfill both the arrangement pitch P1 and the gate pitch P2 with the sufficient performance.

For example, a semiconductor device 1Z of a second comparative example as shown in FIGS. 2A and 2B is a structural example in which the super-junction structure and the planar type MOSFET are combined with each other. In this case, the gate pitch P2 of the planar type MOSFETs is set so as to obtain the coherency with the arrangement pitch P1 of the pn junctions (pn pillar pairs). Naturally, the gate pitch P2 of the planar transistors is forced to obtain the coherency with the pitch of the element cells 2 in the super-junction structure (the arrangement pitch P1 of the pn junctions). Thus, it is difficult to strike a balance between the promotion of the low ON resistance based on the super-junction structure, and the optimization of the performance on the switching transistor side (such as the mobility and the gate-to-drain capacitance Qgd). Even when the vertical MOSFET is used instead of using the planar type MOSFET, the above also applies thereto as long as the gate pitch P2 of the vertical MOSFETs is set so as to obtain the coherency with the arrangement pitch P1 of the pn junctions.

In order to cope with the above situation, in any of the embodiments of the present invention, a structure is devised which allows the arrangement pitch P1 of the pn junctions, and the gate pitch P2 to have the optimal sizes, respectively, while the third manufacturing method is adopted which is expected to be effective as the simple manufacturing method. Thus, there are realized a structure for a semiconductor element which satisfactorily ensures a withstand voltage, and thus has the satisfactory switching characteristics, and a method of manufacturing the semiconductor element. Hereinafter, a concrete description will be given.

First Embodiment

FIGS. 3A and 3B are respectively views each showing a structure of a semiconductor device 1A according to a first embodiment of the present invention. Here, FIG. 3A is a top plan view schematically showing the structure of the semiconductor device 1A, and FIG. 1B is a bird's eye view obtained by paying attention to an XZ cross sectional view taken on line A-A' of FIG. 3A. FIGS. 3A and 3B are each schematic views, and thus the present invention is by no means limited to the sizes in these figures. This also applies to any of other embodiments which will be described later.

The semiconductor device 1A of the first embodiment includes an n-type epitaxial layer 120 (a second semiconductor region of a first conductivity type) on a surface of a high impurity concentrated n-type substrate 110 (an n+-type drain layer) as an example of a first semiconductor region of the first conductivity type having a relatively high impurity concentration. Here, the n-type epitaxial layer 120 is lower in impurity concentration than the n-type substrate 110. Although not illustrated in the figures, a drain electrode (first main electrode) is formed on a surface on a side opposite to the n-type epitaxial layer 120 with respect to the high impurity concentrated n-type substrate 110.

The n-type epitaxial layer 120 is divided into an element portion 3 (super-junction element region), and a termination portion 5 (peripheral structure region). Here, element cells 2 each having a parallel pn junction structure, and each composed of a pair of p-type semiconductor region (p-type pillar region) and n-type semiconductor region (n-type pillar region) are provided in the element portion 3. Also, the termination portion 5 is provided so as to surround the element portion 3. As an example, the element portion 3 is several millimeters (for example, 2 to 5 mm)×several millimeters, and the termination portion 5 is several hundreds of micrometers in width.

In the element portion 3, a plurality of p-type epitaxial buried layers 122 (second pillar regions of a second conductivity type) composing the super-junction structure are formed within trenches 121, respectively, through epitaxial growth. Likewise, in the termination portion 5, a plurality of p-type epitaxial buried layers 123 (the second pillar regions of the second conductivity type) composing the super-junction structure are formed within trenches 121, respectively, through the epitaxial growth. That is to say, the p-type epitaxial buried layers 122 and 123 are periodically disposed in a predetermined direction not only in the element portion 3, but also in the termination portion 5 from the side of the high impurity concentrated n-type substrate 110 to a side opposite thereto. As a result, the super-junction structure is formed. Thus, each of the p-type epitaxial buried layers 122 and 123 function as a p-type drift layer. Also, an n-type epitaxial layer 124 (a first pillar region of the first conductivity type), in a region portion held by each two pairs of p-type epitaxial buried layers 122 and 123, of an n-type epitaxial layer 120 functions as an n--type drift layer.

An entire surface of the n-type epitaxial layer 120 is made to have the same impurity concentration, whereby the n-type epitaxial layers 124 in the element portion 3 and the n-type epitaxial layers 124 in the termination portion 5 are formed so as to have the same impurity concentration. Also, the element portion 3 and the termination portion 5 are made to have the identical impurity concentration when burying the trenches 121, whereby the p-type epitaxial buried layers 122 and 123 are formed to have the same impurity concentration.

Although an illustration is omitted here for the sake of simplicity, a p-type guard ring is formed in a boundary region between the termination portions 5 as may be necessary, and a channel stopper is formed in a surface portion on the source electrode side of the n-type epitaxial layer 120 in the periphery of the termination portion 5 as may be necessary. This also applies to any of other embodiments which will be described later.

There is obtained the semiconductor device 1A having the super-junction structure in which overall, the pair of p-type epitaxial buried layers 122 and 123, and the n-type epitaxial layer 124 are alternately, repetitively disposed within the n-type epitaxial layer 120 formed on the high impurity concentrated n-type substrate 110. The high impurity concentrated n-type substrate 110 on the lower surface side of the semiconductor device 1A becomes a high voltage electrode (drain electrode), and the side opposite to the high impurity concentrated n-type substrate 110 becomes a low voltage electrode (source electrode). Normally, the low voltage electrode is used at the grounding potential.

The p-type pillar region (the p-type epitaxial buried layers 122 and 123), and the n-type pillar region (the n-type epitaxial layer 124) become in cross sectional structure thereof a pair of p-type pillar-like semiconductor region and n-type pillar-like semiconductor region. That is to say, the p-type epitaxial buried layers 122 and 123 are arranged in pillar-like shapes (in a Y direction), respectively, within the n-type epitaxial layer 120 composing the n-type pillar region. The n-type epitaxial layer 124 as an n-type pillar semiconductor region held between each two pairs of p-type epitaxial buried layers 122 and 123 is also arranged in a pillar-like shape. On the other hand, the planar structure of the p-type pillar region and the n-type pillar region is such that the p-type epitaxial buried layers 122 and 123 are arranged in stripe shapes, respectively, within the n-type epitaxial layer 120 composing the n-type pillar region. Also, the n-type epitaxial layer 124 as the n-type pillar-like semiconductor region held between each two pairs of p-type epitaxial buried layers 122 and 123 is also arranged in a stripe shape.

In the layout shown in FIGS. 3A and 3B, the trenches 121 composing the super-junction structure, and the p-type silicon epitaxial layers (the p-type epitaxial buried layers 122 and 123) filled in the trenches 121, respectively, extend in the Y direction in these figures in parallel with one another so as to have the stripe disposition. In this case, when attention is paid to the termination portion 5 in the periphery of the element portion 3, the feature is such that the trenches 121 and the p-type silicon epitaxial layers filled therein, respectively, extend in the longitudinal direction (in the Y direction) not only within the element portion 3 (device main portion), but also up to the termination portion 5, and are arranged approximately at the same pitch and size (width and depth) as those of the element portion 3 in the X direction as well in parallel with one another. "The width" means a width about the direction (X direction) along which the p-type epitaxial buried layers 122 and 123, and the n-type epitaxial layer 124 in the same depth position alternately appear. "Approximately the same" means that a difference of about several percentages (for example, 5% or less) is allowable. In this case, it is noted that although the trenches 121 for formation of the p-type epitaxial buried layers 122 and the p-type epitaxial buried layers 123 are repetitively formed approximately at the equal trench width interval and at the equal trench interval (at the arrangement pitch), this is not essential to the present invention. However, the advantage that the devices can be uniformly formed, and the contribution to the promotion of the high withstand voltage in the termination portion 5 can also be obtained is obtained in the case of "approximately the same" rather than any of other cases.

Here, the p-type epitaxial buried layers 122 and 123 are formed by application of the third manufacturing method. That is to say, the p-type epitaxial buried layers 122 and 123 (the stripe-like pillar region of the second conductivity type) are formed over the entire region of the device approximately at the same size (width and depth) and approximately at the same pitch in the predetermined direction. Also, the p-type epitaxial buried layers 122 and 123 are made based on the formation of the trenches, and the epitaxial growth of the p-type (second conductivity type) semiconductor. At this time, each of the p-type epitaxial buried layers 122 and 123 is formed at an aspect ratio of 12 or more to have a width of 3 μm or less. It is noted that this does not mean that a lower limit of the width is 0 μm, and thus the lower limit of the width depends on the withstand voltage Vb, and the impurity concentration C of the each of the p-type epitaxial buried layers 122 and 123, or the n-type epitaxial layer 124, and is set as about 1 μm as an example. A technique for "digging" a trench at a high aspect ratio of 12 or more can be realized by progress of, for example, an Inductively Coupled Plasma (ICP) etcher or Reactive Ion Etching (RIE). Or, a special manufacturing method typified by a silicon deep etching technique such as anisotropic etching or an LIGA process may also be adopted.

As has been described, the semiconductor device 1A of the first embodiment is a device in which the p-type epitaxial buried layer 122 (semiconductor P-type region) and the n-type epitaxial layer 124 (semiconductor N-type region) are alternately, repetitively arranged, and are completely depleted in the phase of the reverse bias. In this case, the n-type epitaxial layer 124 (the pillar region of the first conductivity type) is formed integrally with the high impurity concentrated n-type substrate 110 so as to cover the entire surface of the high impurity concentrated n-type substrate 110. Also, the p-type epitaxial buried layers 122 (the pillar regions of the second conductivity type) in the element portion 3 are formed by repetitively forming the stripe-like trenches. In addition thereto, the p-type epitaxial buried layers 123 are formed in the termination portion 5 (peripheral region) surrounding the element portion 3 in the same direction as that of each of the p-type epitaxial buried layers 122 and in the same arrangement relationship as that of each of the p-type epitaxial buried layers 122.

That is to say, the p-type epitaxial buried layers 123 are made to extend in the same direction as that of extension of each of the stripes of the p-type epitaxial buried layers 122, and are arranged away from one another in the repetitive direction of the stripes. During formation of such a structure, the n-type regions (the n-type epitaxial layers 124) are formed on the epitaxial substrate of the n-type as the first conductivity type (the n-type epitaxial layer 120). Also, the P-type regions (the p-type epitaxial buried layers 122 and 123) are formed by filling the p-type semiconductor in each of the trenches through the epitaxial growth after formation of the trenches in the n-type epitaxial layer 120. At this time, the trench width and the crystal plain orientation in the trench opening are both made constant.

Adoption of such a manufacturing method and a structure results in that during formation of the trenches, and formation of the p-type epitaxial buried layers 122 and 123, approximately the same crystal plain orientation and trench opening area ratio can be realized within the chip (i.e., within the element portion 3) and over the entire area of the wafer (i.e., up to the termination portion 5) without appearance of the various silicon substrate crystal plain orientations. As a result, the stable super-junction structure can be obtained in the phase of the manufacture. Also, the study for the pattern optimization becomes easy, and the pattern design becomes simple without depending on the specification. Since the termination portion 5 is formed to have the same structure as that of the element portion 3, the semiconductor device 1A can be manufactured in the inexpensive manufacture process without increasing the number of processes. Moreover, when the stripe arrangement of the p-type epitaxial buried layers 123 is extended over the entire surface of the wafer beyond the semiconductor device 1A, there is no necessity for especially forming the channel stop (the reduction of the channel stop becomes possible) as long as the p-type epitaxial buried layer 123 in the device side edge (the most peripheral portion of the termination portion 5 in the semiconductor device 1A) is utilized as the channel stop.

For example, when each of the trench opening sizes (widths) for the p-type epitaxial buried layers 123 in the termination portion 5 is made too narrower than the width of each of the trenches for the p-type epitaxial buried layers 122 in the element portion 3, in general, the etching depth becomes shallow, and thus the size of each of the p-type epitaxial buried layers 122 in the depth direction becomes unstable. In addition, contrary to this, when each of the trench opening sizes (widths) is too wide, in other words, when each of the aspect ratios (depth/width) is too small, there is caused a problem that the trenches cannot be sufficiently filled with the p-type semiconductor through the epitaxial growth in the phase of the subsequent formation of the p-type epitaxial buried layers 123. In addition, when the direction of extension of each of the trenches for the p-type epitaxial buried layers 123 in the termination portion 5 is made different from that of each of the trenches for the p-type epitaxial buried layers 122 in the element portion 3 (for example, made vertical thereto), such trenches are influenced by the crystal plain orientation of the substrate (the high impurity concentrated n-type substrate 110). As a result, there are caused a problem that the trenches cannot be sufficiently filled with the p-type semiconductor through the epitaxial growth in the phase of the subsequent formation of the p-type epitaxial buried layers 123, nonconformity such as abnormal growth, and the like.

On the other hand, in the semiconductor device 1A of the first embodiment, each of the p-type epitaxial buried layers 122 and 123 is formed at the aspect ratio of 12 or more to have the width of 3 μm or less, thereby dissolving the problem described above. As a result, the characteristics in the termination portion 5 becomes stable, so that the promotion of the high withstand voltage in the termination portion 5 is attained. The reason for this is because it contributes to the promotion of the high withstand voltage in the termination portion 5 that during the formation of the trenches, the crystal plain orientation and the shape (the rectangular stripe having the longitudinal direction) are both fixed, thereby holding the etching shape constant, and during the filling of the trenches through the epitaxial growth of the p-type semiconductor, the crystal plain orientation and the shape are both made constant and thus the epitaxial growth conditions are stably held.

Moreover, in the semiconductor device 1A of the first embodiment, each of the MOSFETs on the surface portion on the side opposite to the high impurity concentrated n-type substrate 110 having the element cells 2, composing the super-junction structure, arranged in stripe shapes is structured in the form of an n-channel vertical MOSFET 150 having a trench gate structure as a MOS gate structure instead of being structured in the form of the planar type MOSFET.

In addition thereto, the semiconductor device 1A of the first embodiment features the arrangement form of the vertical MOSFETs 150. Specifically, the features of the vertical MOSFETs disposed on the super-junction structure in which the p-type epitaxial buried layer 122 (the pillar region of the second conductivity type) and the n-type epitaxial layer 124 (the pillar region of the first conductivity type) are alternately, repetitively arranged is that although a gate oxide film and a gate electrode are formed within the relatively shallow trench, the gate electrodes are extended at an angle of 45° on one side with respect to the Y-axis direction in FIGS. 3A and 3B (a clockwise direction is set as being positive) in parallel with one another.

FIGS. 3A and 3B show the example of the stripe-like arrangement in which each of the trenches 154 (that is, each of the gate electrodes 158) intersects clockwise at the angle of 45° with respect to the Y-axis direction as the extension direction of each of the trenches 121. However, contrary to this, a form of a stripe-like arrangement may also be adopted such that each of the trenches 154 intersects counterclockwise at an angle of—45° with respect to the Y-axis direction.

In the semiconductor device 1A of the first embodiment, as shown in FIGS. 3A and 3B, a p-type base region 151 is formed over the entire surface of the surface portion side of the element portion 3 so as to contact both the p-type epitaxial buried layers 122 and the n-type epitaxial layers 124. P-type base regions 161 are selectively formed in stripe shapes in the same direction as that of each of the p-type epitaxial buried layers 122 so as to be aligned with the respective p-type epitaxial buried layers 122 on the surface of the p-type base region 151. Therefore, in the first embodiment, the arrangement pitch of the p-type base regions 161 is also adjusted to the pitch of the super-junction structure. In the element portion 3, a pitch of the high withstand voltage structures of the super-junction structure (a repetitive pitch of the p-type epitaxial buried layer 122) is generally in the range of about more than 10 μm to about several tens of micrometers. An impurity concentration of the p-type base region 151, and an impurity concentration of each of the p-type base regions 161 may be identical to each other. Therefore, basically, the distinction between the p-type base region 151 and each of the p-type base regions 161 is unnecessary.

N-type source regions 152 are selectively formed on the surface of the p-type base region 151. It is noted that with regard to the planar surface side in FIGS. 3A and 3B, the n-type source regions 152 formed on both sides of each of the trenches 154, respectively, are omitted in illustration thereof for the sake of simplicity. Moreover, a plurality of trenches 154 each having a relatively shallow depth (each shallower than each of the trenches 121) and each extending from corresponding one of the n-type source regions 152 to corresponding one of the p-type epitaxial buried layers 122 and the n-type epitaxial layer 124 through the p-type base region 151 are arranged and formed so as to correspond to the n-type source regions 152, respectively. In such a trench gate structure, for the purpose of ensuring a channel, a bottom portion of each of the trenches 154 is formed so as to be equal to or deeper than the p-type base region 151.

A gate oxide film 156 (gate insulating film) is formed on an inner wall of each of the trenches 154, and a gate electrode 158 is filled in each of the trenches 154 through corresponding one of the gate oxide films 156. Although not illustrated, source electrodes are formed on upper layer sides of the n-type source regions 152, respectively, and are commonly connected to one another. With these structures, the gate electrode 158, the n-type source region 152, and the p-type base region 151 compose an n-channel MOSFET for electron injection having a channel region formed on a surface of the p-type base region 151 on a sidewall of corresponding one of the trench 154.

Here, in the semiconductor device 1A of the first embodiment, the relative deep trench 121 (deeper than the trench 154) for formation of the p-type epitaxial buried layers 122 and 123 is formed so that a (110) plain orientation appears in the sidewall of the trench 121. Also, the p-type epitaxial buried layers 122 and 123 are formed within the trench 121 through the epitaxial growth of silicon containing therein an impurity of the p-type as the second conductivity type.

Moreover, a MOSFET as a switching element disposed on the super-junction structure has a vertical structure in which the gate oxide film 156 and the gate electrode 158 are formed within the trench 154 for every n-type source region 152 selectively formed on the surface portion of the p-type base region 151 (hereinafter referred to as "a vertical MOSFET 150"). Also, the vertical MOSFET 150 is formed so that a (100) plain orientation appears in the sidewall of the trench 154. With regard to the structure for this, the extension direction (the Y-axis direction) of the deep trench 121 of the super-junction, and the extension direction of the trench 154 of the vertical MOSFET 150 are made to intersect at an angle of 45° with each other on one side. The trench 121 for formation of the super-junction structure, and the trench 154 for formation of the vertical MOSFET are preferably, repetitively arranged at the equal trench width intervals, and at the equal trench interval (at the arrangement pitch).

As has been described, the trenches 154 forming the respective vertical MOSFETs 150 provided on the super-junction structure, that is, the gate electrodes 158 are arranged in stripe shapes in parallel with one another so as to extend at an angle of 45° with respect to the Y-axis direction. In this case, the feature of the gate electrode 158 is that the gate electrodes 158 are arranged in parallel with one another approximately at the equal pitch and approximately at the equal size (width and depth) in the element portion 3. "The width" means a width about the direction made at the angle of 45° with respect to the Y-axis direction in the same depth position. "Approximately the same" means that a difference of about several percentages (for example, 5% or less) is allowable. It is noted that although in this case, the trench 154 for formation of the gate electrode 158 is repeated approximately at the equal trench width, and at the equal trench intervals (at the equal arrangement pitch), this is not essential to the present invention. However, the advantage that the vertical MOSFETs 150 can be uniformly formed is obtained in the case of "approximately the same" rather than any of other cases. In addition, the trench 154 is formed at the angle of 45° with respect to the Y-axis direction, which results in that the (100) plain orientation is exposed as the silicon crystal plain orientation of each of the bottom portion in the depth direction and the side surface of the trench 154. Therefore, the gate insulating film formed on the bottom portion and the side surface of the trench 154 having the (100) plain orientation exposed therein ensures the same film quality and interface level as those of the gate insulating film formed on the surface of the (100) Si substrate which is generally used in the MOS device, the BiCMOS (Bipolar Complementary Metal Oxide Semiconductor) device, the BCD (Binary-Coded Decimal) device, and the like. Thus, there is an advantage that the highly reliable gate insulating film can be formed.

A silicon substrate plain orientation is used for formation of the pn pillar (super-junction structure) based on the deep trench 121 so as to obtain the (110) plain orientation. In addition thereto, the gate electrode (the sidewall of the shallow trench 154) of the vertical MOSFET 150 of the switching device is given an offset of 45° so as to cause the (100) plain orientation to appear. The vertical MOSFET 150 acts as a switch having a channel on the n-type epitaxial layer 124 (the n-type pillar region), whereas the vertical MOSFET 150 does not contribute to the switching operation on the p-type epitaxial buried layer 122 (the p-type pillar region) because it is simply integrated with the p-type base region 151.

With regard to the first feature, during the formation of the two kinds of trenches, the two kinds of trenches are made to intersect obliquely (at the angle of 45° in the first embodiment) with each other. As a result, the vertical MOSFETs 150 can be manufactured in accordance with the miniaturization optimal rule with the transistor pitch without being limited in the arrangement pitch P1 of the pn junctions of the super-junction structure. Normally, each of the trenches 154 is shallower than each of the trenches 121, and thus each of the trenches 154 of the vertical MOSFETs 150 can be manufactured in accordance with the minuter process rule.

With regard to the second feature, in the case where silicon (Si) is used as the base material, when each of the trenches 121 of the super-junction structure is formed so as to obtain the (100) plain orientation, each trench 121 and each trench 154 are made to intersect at the angle of 45° with each other, which results in that the (100) plain orientation is selected for the sidewall of each of the relatively shallow trenches 154 for the gate electrodes of the vertical MOSFETs 150. The electrical conductivity (specifically, the carrier mobility when the impurity is implanted) differs depending on the plain orientation of the crystal of the semiconductor. However, in the case of silicon, since the feature of the (100) plain orientation is that the number of interface levels is less and thus the mobility is high, the low ON resistance and the threshold voltage Vth are stabilized. As a result, the satisfactory switching characteristics are obtained.

With regard to the third feature, during the formation of the two kinds of trenches, the two kinds of trenches are made to intersect obliquely (at the angle of 45° in the first embodiment) with each other, which results in that there is no necessity for taking an influence of the position misalignment between the two kinds of trenches into consideration. Thus, the stabilized super-junction structure is obtained in the manufacturing.

As has been described, in the first embodiment, the super-junction structure is formed by filling silicon containing therein the p-type impurity in each of the deep trenches 121 through the epitaxial growth, and the trench 121 is formed so that the (110) plain orientation appear in each of the sidewalls of the trenches 121. In addition thereto, the vertical MOSFETs 150 having the trenches 154 each having the predetermined gate width are disposed in the direction making at the angle of 45° with the longitudinal direction of each of the trenches 121, whereby the vertical MOSFETs 150 are structured so that the (100) plain orientation appears in each of the sidewalls of the shallow trenches 154. As a result, the deep trenches 121 and the shallow trenches 154 can be disposed at the optimal pitches, respectively, whereby the low ON resistance is realized, and the stable epitaxial filling property based on the setting of the plain orientation for each of the deep trenches 121, and the stabilization of the forward voltage drop Vfb based on the setting of the plain orientation for each of the shallow trenches 154 are simultaneously made to be compatible with each other.

In the switching MOSFET element for the power source application, the super-junction structure in which the p-type pillar region and the n-type pillar region are repetitively disposed, and are completely depleted in the phase of application of the reverse bias is used for ensuring the high withstand voltage of 500 V or more. A combination of this technique with the MOSFET makes it possible to simultaneously realize the low ON resistance and the high withstand voltage of the switching element. In a combination of this technique with the gate metal buried type vertical switching transistor, the trench plain orientation in the super-junction structure, and the trench plain orientation in the control electrode of the vertical switching device are regulated so as to make at the angle of 45° with each other, which results in that the drawing of the optimal performance of both of the super-junction structure and the vertical switching device, and the reduction in chip area can be made compatible with each other.

Second Embodiment

Figure 4A:
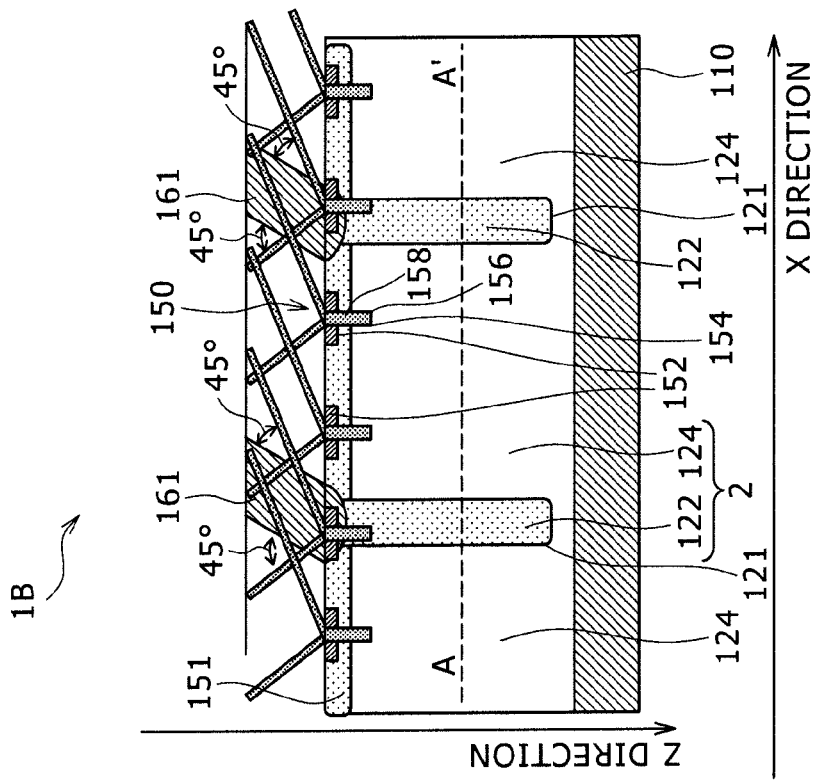
FIGS. 4A and 4B are respectively a top plan view and a bird's eye view each showing a structure of a semiconductor device according to a second embodiment of the present invention.
Figure 4B:
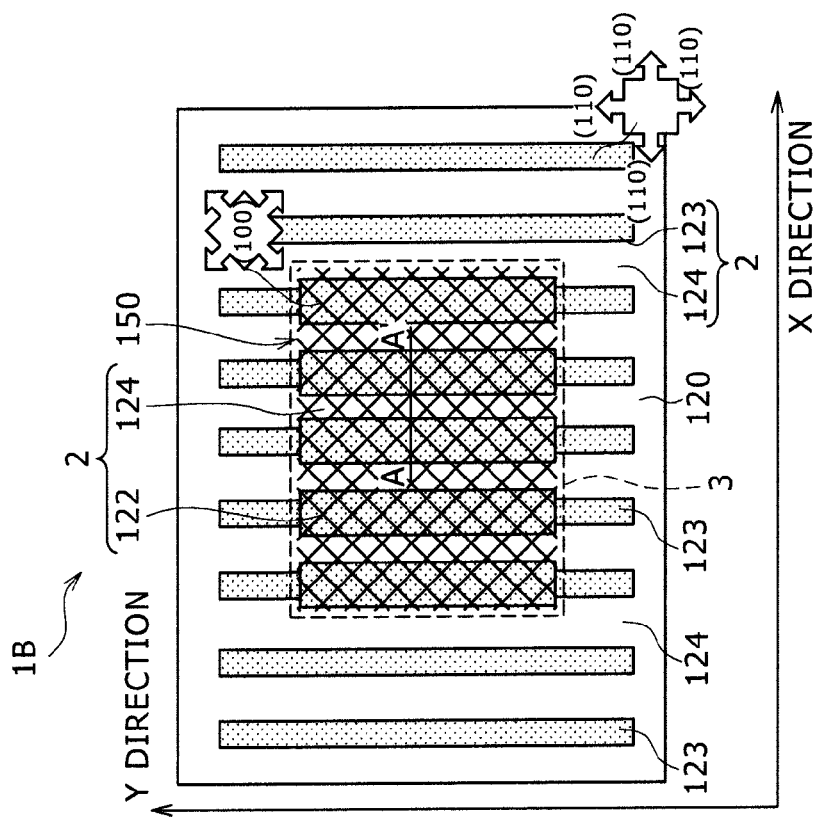

FIGS. 4A and 4B are respectively views showing a structure of a semiconductor device 1B according to a second embodiment of the present invention. Here, FIG. 4A is a top plan view schematically showing the structure of the semiconductor device 1B, and FIG. 4B is a bird's eye view obtained by paying attention to an XZ cross section taken on line A-A' of FIG. 4A.

In the semiconductor device 1B of the second embodiment, the disposition form of the vertical MOSFET 150 is slightly changed while the structure of the first embodiment is basically applied to the super-junction structure. The feature of the basic way of thinking about the change is that although in the vertical MOSFET, the gate oxide film 156 and the gate electrode 158 of the gate are formed within the shallow trench 154, the gate electrodes 158 extend in parallel at an angle of 45° with each other on both sides of the Y-axis direction in the figures (that is, at the angles of ±45° with the Y-axis direction). That is to say, in the second embodiment, each of the trenches 154 (that is, each of the gate electrodes 158) has both a first stripe-like arrangement which intersects clockwise at an angle of 45° with the Y-axis direction as the extension direction of each of the trenches 121, and a second stripe-like arrangement which intersects counterclockwise at an angle of 45° with the Y-axis direction. Thus, the gate electrodes 158 are arranged in a lattice (in a square lattice oblique with respect to the Y-axis) based on a combination of the first and second stripes. Other respects are the same as those in the first embodiment.

With regard to the extension direction (the Y-axis direction) of each of the deep trenches 121 in the super-junction, and the extension direction of each of the trenches 154 of the vertical MOSFETs 150, the trench 154 which intersects at the angle of +45° with the Y-axis direction as the extension direction of the trench 121 is defined as a trench 154a. On the other hand, the trench 154 which intersects at the angle of −45° with the Y-axis direction is defined as a trench 154b. The trench 121 for formation of the super-junction structure, and the trench 154 for formation of the vertical MOSFET 150 are repeated preferably at the equal trench width intervals, and at the equal trench intervals (at the arrangement pitch), respectively. Although this repetition results in the square lattice structure, the feature of the pattern is that the trenches 154a and 154b incline at the angles of ±45° with the pn junction direction of the super-junction structure, respectively.

The two directions making at the angles of ±45° with the Y-axis direction, respectively, correspond to the plain orientations having the same feature in terms of the silicon crystal. Thus, the relatively shallow trenches 154a and 154b, in the two directions for the gate of the vertical MOSFET 150, which are formed along the plain orientations, respectively, both have the (100) plain orientation in the side surfaces (sidewalls) thereof. With regard to the structure as well, the gate of the vertical MOSFET 150 of the switching device (the sidewall of the shallow trench 154) is given an offset of 45° so that the (100) plain orientation appears in the sidewall of the shallow trench 154.

Therefore, similarly to the case of the first embodiment, the vertical MOSFET 150 acts as a switch having a channel on the n-type epitaxial layer 124 (the n-type pillar region), whereas the vertical MOSFET 150 does not contribute to the switching operation on the p-type epitaxial buried layer 122 (the p-type pillar region) because it is simply integrated with the p-type base region 151. As a result, the first to third features peculiar to the first embodiment are similarly obtained in the second embodiment as well.

Here, when the first and second embodiments are compared with each other, the second embodiment has an advantage that the vertical MOSFETs 150 are densely disposed as compared with the case of the first embodiment. In addition, even when the trench 154 is formed in the two directions making the angles of +45° with the Y-axis direction, respectively, the (100) plain orientation is exposed as the Si crystal plain orientation in the bottom portion in the depth direction, and the side surface of the trench 154 similarly to the case of the first embodiment. Therefore, the gate insulating film formed on the bottom portion and the side surface of the trench 154 having the (100) plain orientation exposed therein ensures the same film quality and interface level as those of the gate insulating film formed on the surface of the (100) Si substrate which is generally used in the MOS device, the BiCMOS device, the BCD device, and the like. Thus, there is an advantage that the highly reliable gate insulating film can be formed.

Manufacturing Method

Figure 5G:
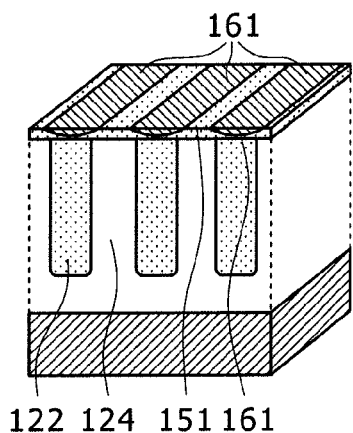
Figure 5H:
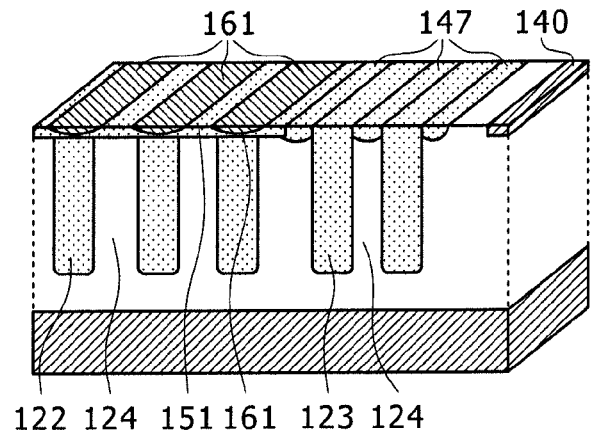
Figure 5I:
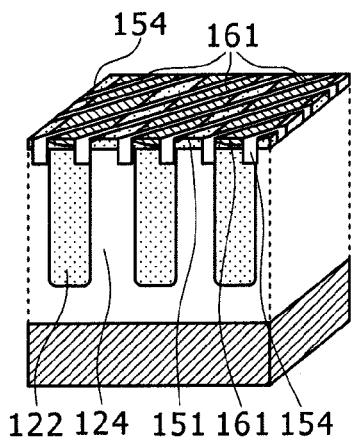
Figure 5J:
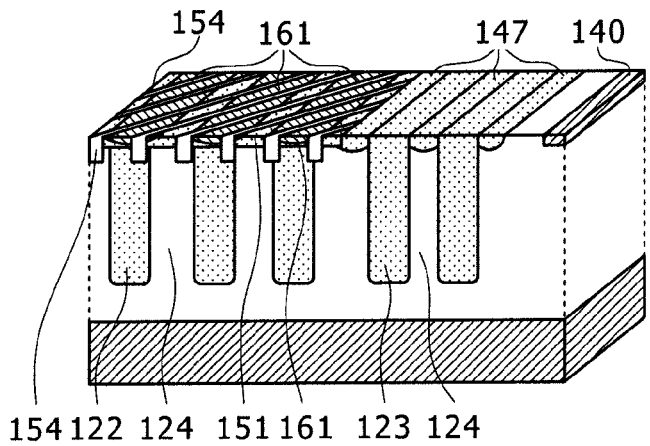
Figure 5K:
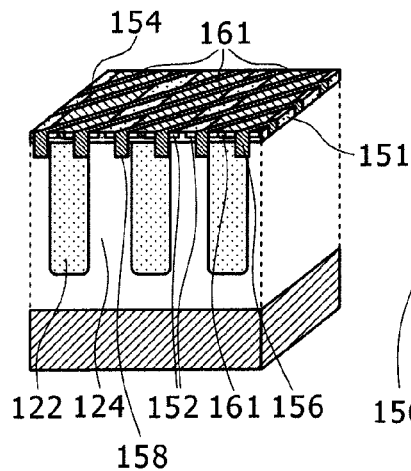
Figure 5L:
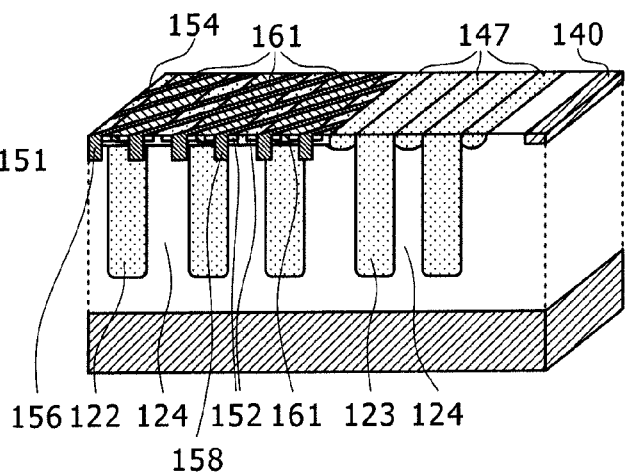
Figure 5M:
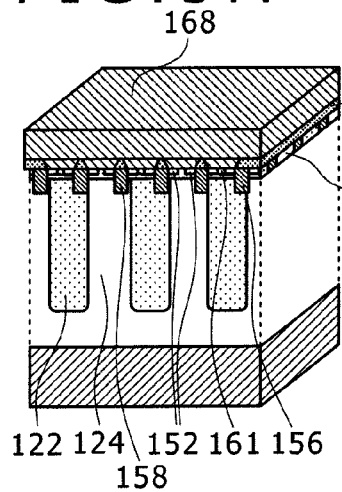
Figure 5N:
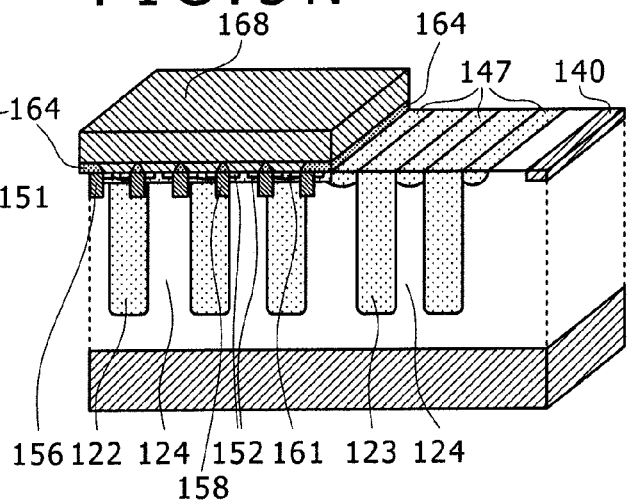

FIGS. 5A to 5N are respectively views explaining a technique of a method of manufacturing the semiconductor device 1A according to the first embodiment of the present invention. Also, FIGS. 5A to 5N show the element portion 3 (around the center thereof), and the portion from the element portion 3 to the termination portion 5 (corresponding to the cross section taken on line A-A' of FIG. 3A). In the figures, FIGS. 5A, 5C, 5E, 5G, 5I, 5K, and 5M on the left-hand side thereof each show the central portion of the element portion 3, while FIGS. 5B, 5D, 5F, 5H, 5J, 5L, and 5N on the right-hand side thereof each show the portion from the element portion 3 to the termination portion 5, and a boundary portion of that portion. It is noted that in each of FIGS. 5C to 5F, an illustration of the high impurity concentrated n-type substrate 110 is omitted for the sake of simplicity.

As previously stated, the trench forming epitaxial back-filling manufacturing method (third manufacturing method) in which the trenches are formed in the thick epitaxial layer (n-type epitaxial layer 120), silicon containing therein the impurity is back-filled in each of the trenches formed once through the epitaxial growth is applied, thereby forming the p-type epitaxial buried layers 122 and 123. The number of times of the trench formation and buried growth can be set as one time.

Firstly, the n-type epitaxial layer 120 is formed on the high impurity concentrated n-type substrate 110 composing the drain layer. The impurity concentration at this time, for example, is set at about 5E14 to about 1E16 ions/cm^3. Also, the trenches (the trenches 121) are formed within the n-type epitaxial layer 120 formed on the high impurity concentrated n-type substrate 110 in both the element portion 3 and the termination portion 5 through the etching processing by using a photo resist, an oxide film hard mask or the like at such an aspect ratio as to fulfill the width W and the depth D of the p-type epitaxial buried layers 122 and 123 which are finally required (refer to FIGS. 5A and 5B). At this time, the trenches 121 for the p-type epitaxial buried layers 122 and 123 are formed approximately at the same size, approximately at the same pitch and in the given direction over the entire region of the device (the width and the repetitive pitch of each of the trenches 121 are made constant over the entire region). In addition, preferably, the p-type epitaxial buried layers 122 and 123 are formed at the width of 1 to 3 μm and at the aspect ratio of 12 or more.

After that, the p-type semiconductor is filled in each of the trenches 121 through the epitaxial growth, thereby forming the super-junction structure. For example, the p-type epitaxial buried layer 125 which will compose the p-type epitaxial buried layers 122 and 123 later is epitaxially grown so as to be filled in each of the trenches 121 (refer to FIGS. 5C and 5D). Moreover, after the p-type epitaxial buried layer 125 which will compose the p-type epitaxial buried layers 122 and 123 later is epitaxially grown so as to be filled in each of the trenches 121, the p-type epitaxial buried layer 125 is backward polished until the surface of the n-type epitaxial layer 124 is exposed by utilizing a Chemical Mechanical Polishing (CMP) technique or the like, thereby subjecting the surface of the p-type epitaxial buried layer 125 to mirror polish processing. As a result, there are obtained the p-type epitaxial buried layers 122 and 123 filled in each of the trenches 121 (refer to FIGS. 5E and 5F).

By carrying out the processes described above, there is obtained the super-junction structure in which the pair of p-type epitaxial buried layers 122 and 123, and the n-type epitaxial layer 124 are alternately, repetitively disposed approximately at the same width and approximately at the same pitch within the n-type epitaxial layer 120 formed on the high impurity concentrated n-type substrate 110. The n-type epitaxial layer 124 is formed from the n-type epitaxial layer 120 itself. Also, each of the p-type epitaxial buried layers 122 and 123 is formed by filling the p-type semiconductor containing therein the impurity having the predetermined concentration in each of the trenches 121 formed in the n-type epitaxial layer 120 through the epitaxial growth. The trenches 121 are formed approximately at the same size, approximately at the same pitch, and in the given direction over the entire region of the device. Therefore, the pairs of p-type epitaxial buried layers 122 and 123 are formed approximately at the same size, and approximately at the same pitch, and in the given direction over the entire region of the device by filling the n-type semiconductor in each of the trenches 121 through the epitaxial growth.

After the surface of the p-type epitaxial buried layer 125 is subjected to the mirror polish processing by utilizing the CMP technique or the like, a channel stopper 140 is formed in the surface portion of the n-type epitaxial layer 120 in the periphery on the termination portion 5 side. Moreover, a guard ring portion 147 is disposed on the surface portion of the boundary region with the element portion 3 as may be necessary (refer to FIG. 5H).

Moreover, the various kinds of elements, composing the MOSFET, such as the base region, the gate insulating film, the gate electrode, the source region, and the source electrode are formed on the element portion 3 side, thereby completing the vertical MOSFET having the super-junction structure. For example, a mask is formed on the surface on the side opposite to the side of the high impurity concentrated n-type substrate 110 with respect to the p-type epitaxial buried layer 122 so as to be aligned with the p-type epitaxial buried layer 122, and under this condition, an impurity having a predetermined concentration is implanted so as to form p-type semiconductor regions (refer to FIGS. 5G and 5H). As a result, p-type base regions 151 and 161 are formed in the element portion 3 so as to be connected to the p-type epitaxial buried layers 122. In FIGS. 5G and 5H, an illustration of any of the n-type source regions on the planar surface side is omitted for the sake of simplicity. It is noted that although the description is given in coherency with FIGS. 3A and 3B, as previously stated, the impurity concentration of the p-type base region 151, and the impurity concentration of the p-type base region 161 may be identical to each other. Therefore, basically, the distinction between the p-type base region 151 and the p-type base region 161 is unnecessary, and thus it may be unnecessary to specially form the p-type base region 161.

Moreover, trenches (trenches 154) each shallower than each of the trenches 121 are formed in the surface of the p-type base region 151 by carrying out the etching processing using the photo resist or the oxide film hard mask so as to reach the respective p-type epitaxial buried layers 122 and the respective n-type epitaxial layers 124 through the p-type base region 151 (refer to FIGS. 5I and 5J).

At this time, an angle between each trench 121 and each trench 154 is set at 45°. This setting means that when silicon is used as the base material, the gate electrodes 158 are arranged in the stripe shapes so as to intersect with the stripes of the trenches 121 of the pn pillar pairs (especially, the p-type epitaxial buried layers 122), respectively. Also, the setting means the situation set such that the crystal plain orientation appearing in each of the sidewalls of the trenches 154 composing the gate electrodes 158 becomes a plain orientation which is higher in carrier mobility when the impurity is implanted than the crystal plain orientation appearing in each of the sidewalls of the trenches 121.

Also, the gate oxide film 156 (gate insulating film) is formed within each of the trenches 154, and after that, for example, an n-type polysilicon material becoming each of the gate electrodes 158 is filled in each of the trenches 154, thereby forming the n-type source regions 152 in parallel on the both sides of each of the gate electrodes 158, respectively (refer to FIGS. 5K and 5L). The order of the formation of the n-type source regions 152, and the formation of the trenches 154 may be reversed. It is noted that with regard to the planar surface side in FIGS. 5K and 5L, an illustration of each of the n-type source regions 152 formed on the both sides of each of the trenches 154 is omitted for the sake of simplicity.

Moreover, an insulating film 164 (for example, a CVD oxide film) is formed as an upper layer overlying the constituent elements described above, contact openings for connection with the gate electrodes 158 and the n-type source regions 152 are provided in the insulating film 164, and also a metal layers for the source electrodes and the gate electrodes are formed as surface layers. After that, these surface layers are processed and separated into the source electrodes 168 and the gate electrodes (not shown) (refer to FIGS. 5M and 5N).

Although the present invention has been described so far based on the first and second embodiments, the technical scope of the present invention is by no means limited to the scope described in the first and second embodiments. That is to say, the various changes and improvements can be made for the first and second embodiments described above without departing from the gist of the present invention, and the illustrative embodiments for which such changes and improvements are made are also included in the technical scope of the present invention.

In addition, the embodiments described above are not construed to limit the present invention claimed in the appended claims, and also all the combinations of the features described in the embodiments are not necessarily essential to the means for solving the problems by the present invention. The inventions in various stages are contained in the embodiments described above, and thus the various inventions can be extracted based on suitable combinations in a plurality of composition requirements disclosed. Even when some of the composition requirements are deleted from all the composition requirements disclosed in the embodiments described above, the constitutions obtained through deletion of some of the composition requirements can be extracted as the inventions.

For example, although in each of the first and second embodiments, none of the bottom surfaces of the p-type epitaxial buried layers 122 and 123 (that is, the trenches 121) reaches the high impurity concentrated n-type substrate 110, a structure may also be adopted such that each of the bottom surfaces of the p-type epitaxial buried layers 122 and 123 reaches the high impurity concentrated n-type substrate 110.

Although in each of the first and second embodiments, the p-type semiconductor region is used as the semiconductor region filled in each of the trenches 121, an n-type semiconductor region may also be used instead of using the p-type semiconductor region. That is to say, a structure may also be adopted such that the trenches 121 are formed in a p-type single-crystal semiconductor layer disposed on the high impurity concentrated n-type substrate 110, and an n-type epitaxial layer is filled in each of the trenches 121.

Although in each of the first and second embodiments, the n-type semiconductor substrate (the high impurity concentrated n-type substrate 110) is used, a p-type semiconductor substrate may also be used instead. That is to say, any of first and second structures may also be used instead as the super-junction structure. A first structure is such that the trenches 121 are formed in a p-type single-crystal semiconductor layer disposed on the p-type semiconductor substrate, and an n-type epitaxial layer is filled in each of the trenches 121. Also, a second structure is such that the trenches 121 are formed in an n-type single-crystal semiconductor layer disposed on the p-type semiconductor substrate, and a p-type epitaxial layer is filled in each of the trenches 121.

Although in each of the first and second embodiments, the n-channel vertical MOSFET 150 is shown as the MOSFET as an example of the switching device disposed on the super-junction structure, a p-channel vertical MOSFET may also be available instead.

Although in each of the first and second embodiments, the power MOSFET (insulated gate field-effect transistor) is exemplified, the present invention can also be applied to a semiconductor device as long as the super-junction structure can be applied to the semiconductor device. For example, the present invention can also be applied to a vertical semiconductor structure, for allowing the promotion of the high withstand voltage, and the promotion of the large current capacity to be made compatible with each other, such as an Insulated Gate Bipolar Transistor (IGBT), a Schottky Barrier Diode (SBT), or a normal bipolar transistor or diode.

Although each of the first and second embodiments shows the semiconductor device using silicon (Si) as the semiconductor material, the material (base material) is by no means limited thereto. That is to say, any of the materials may also be used as long as the material makes it possible that an angle between the gate electrode of the transistor having the vertical gate structure, and a pair of pn pillars, disposed in stripe shapes, composing the super-junction structure is set at 45°, whereby the crystal plain orientation appearing in each of the sidewalls of the trenches for formation of the pn pillar pair is made the (110) plain orientation, and the crystal plain orientation appearing in each of the sidewalls of the trenches for formation of the gate electrodes is made the (100) plain orientation. Alternatively, an angle between the gate electrode of the transistor having the vertical gate structure, and a pair of pn pillars, disposed in stripe shapes, composing the super-junction structure may be set depending on the base materials so that the crystal plain orientation appearing in each of the sidewalls of the trenches for formation of the pn pillar pair is made the (110) plain orientation, and the crystal plain orientation appearing in each of the sidewalls of the trenches for formation of the gate electrodes is made the (100) plain orientation.

In a word, the control electrodes of the vertical transistors are arranged in the stripe shapes so as to intersect the stripes of the second pillar regions, respectively. At this time, the crystal plain orientation appearing in each of the sidewalls of the trenches composing the control electrodes needs to be made the plain orientation which is higher in carrier mobility when the impurity is implanted than the crystal plain orientation appearing in each of the sidewalls of the trenches composing the second pillar region. The reason for this is because during the formation of the two kinds of trenches, the two kinds of trenches are made to intersect obliquely with each other, whereby the vertical MOSFET can be manufactured in accordance with the miniaturization optimal rule without limiting the transistor pitch in the arrangement pitch of the pn junction pairs of the super-junction structure, there is no necessity for taking an influence of the position misalignment between the two kinds of trenches into consideration, and thus the stable super-junction structure is obtained in the phase of the manufacture. In addition thereto, the reason for this is because when the plain orientation which is high in carrier mobility when the impurity is implanted is made to appear in each of the sidewalls of the trenches composing the control electrodes, the low ON resistance and the stabilization of the threshold voltage can be realized.

The trench plain orientation for the pillar pair, and the trench plain orientation for the control electrode of the vertical switching device are individually regulated depending on the base materials, and are formed so as to intersect at the predetermined angle with each other. As a result, the optimal performances of the super-junction structure and the vertical switching device are both drawn, and the chip area is also reduced because the arrangement pitch of the vertical switching devices is narrowed to be suitable to the high integration.

The present application contains subject matter related to that disclosed in Japanese Priority Patent Application JP 2008-205327 filed in the Japan Patent Office on Aug. 8, 2008, the entire content of which is hereby incorporated by reference.

It should be understood by those skilled in the art that various modifications, combinations, sub-combinations and alternations may occur depending on design requirements and other factors insofar as they are within the scope of the appended claims or the equivalent thereof.

What is claimed is:

1. A semiconductor device, comprising:
a first semiconductor region of a first conductivity type disposed at a side of a first electrode;
a second semiconductor region having pairs of first pillar regions of the first conductivity type, and second pillar regions of a second conductivity type alternately provided along a surface on a side of a second electrode disposed on a side opposite said first electrode;
a third semiconductor region of the second conductivity type formed on a surface portion on a side of said second electrode of said second semiconductor region;
a fourth semiconductor region of the first conductivity type formed on a part of a surface of said third semiconductor region so as to be connected to said second electrode; and
control electrodes each provided within a trench and being separated by an insulating film, a sidewall of said trench being formed so as to contact each of said third semiconductor region and said fourth semiconductor region, wherein said second pillar regions are formed by filling a semiconductor of the second conductivity type in each of said trenches formed in said second semiconductor region through epitaxial growth, and are arranged in a stripe pattern in a common direction in an element portion having said third semiconductor region and said fourth semiconductor region disposed therein, said first pillar regions are formed as regions each located between two second pillar regions, and said control electrodes are arranged in stripe shapes so as to intersect at approximately an angle of 45° with a longitudinal direction of the stripes of said second pillar regions.

2. The semiconductor device according to claim 1, wherein said second pillar regions are each substantially identical in width and are arranged having approximately a same depth position; and said control electrodes are substantially identical in width and are arranged having approximately a same depth position.

3. A semiconductor device, comprising:

a first semiconductor region of a first conductivity type disposed at a side of a first electrode;

a second semiconductor region having pairs of first pillar regions of the first conductivity type, and second pillar regions of a second conductivity type alternately provided at a side of a second electrode disposed at a side opposite said first electrode of said first semiconductor region;

a third semiconductor region of the second conductivity type formed at a surface portion at a side of said second electrode of said second semiconductor region;

a fourth semiconductor region of the first conductivity type formed at a part of a surface of said third semiconductor region so as to be connected to said second electrode; and control electrodes each provided within a trench and being separated by an insulating film, a sidewall of said trench being formed so as to contact each of said third semiconductor region and said fourth semiconductor region, wherein said second pillar regions are formed by filling a semiconductor of the second conductivity type in each of said trenches formed in said second semiconductor region through epitaxial growth, and are arranged in stripe shapes in a common direction in an element portion having said third semiconductor region and said fourth semiconductor region disposed therein, said first pillar regions are formed as regions located between two second pillar regions, each of said trenches composing said second pillar regions is formed so that a (110) plane orientation appears in a sidewall of each of said trenches, and each of said trenches composing said control electrodes is formed so that a (100) plane orientation appears in a sidewall of each of said trenches.

4. The semiconductor device according to claim 3, wherein each of said control electrodes has a first stripe-like arrangement which intersect at approximately an angle of 45° with the longitudinal direction of the stripe of said second pillar region, and a second stripe-like arrangement which intersect at approximately an angle of 45° with the longitudinal direction of the stripe of said second pillar region.

5. The semiconductor device according to claim 3, wherein said second pillar regions are substantially identical in width and arrangement pitch in the arrangement direction and located at approximately a the same depth position; and said control electrodes are substantially identical in width and arrangement pitch in the arrangement direction and located at approximately a the same depth position.

6. A semiconductor device, comprising:

a first semiconductor region of a first conductivity type disposed at a side of a first electrode;

a second semiconductor region having pairs of first pillar regions of a first conductivity type, and second pillar regions of a second conductivity type alternately provided at a side of a second electrode disposed on a side opposite to said first electrode of said first semiconductor region;

a third semiconductor region of the second conductivity type formed at a surface portion on a side of said second electrode of the second semiconductor region;

a fourth semiconductor region of the first conductivity type formed at a part of a surface of said third semiconductor region so as to be connected to said second electrode; and control electrodes each provided within a trench and being separated by an insulating film, a sidewall of said trench being formed so as to contact each of said third semiconductor region and said fourth semiconductor region, wherein said second pillar regions are formed by filling a semiconductor of the second conductivity type in each of said trenches formed in said second semiconductor region through epitaxial growth, and are arranged in a stripe pattern in a common direction in an element portion having said third semiconductor region and said fourth semiconductor region disposed therein, said first pillar regions are formed as regions located between each two second pillar regions, said control electrodes are arranged in a stripe pattern so as to intersect with the said second pillar regions, and a crystal plane orientation appearing in a sidewall of each of said trenches composing said control electrodes is a crystal plane orientation which is higher in carrier mobility when an impurity is implanted than a crystal plane orientation appearing in a sidewall of each of said trenches composing the second pillar regions.

7. The semiconductor device according to claim 6, wherein said second pillar regions are substantially identical in width and arrangement pitch in the arrangement direction and located at substantially a same depth; and said control electrodes are substantially identical in width and arrangement pitch in the arrangement direction and located at substantially a same depth.

8. A method of manufacturing a semiconductor device, comprising:

forming a second semiconductor region of a first conductivity type on a first semiconductor region of the first conductivity type;

forming first trenches having the same depth and the same shape in the same direction in said second semiconductor region, thereby forming first pillar regions of the first conductivity type;

filling a semiconductor of a second conductivity type in each of said trenches through epitaxial growth, thereby forming second pillar regions of the second conductivity type;

forming a third semiconductor region of the second conductivity type at a surface portion on a side of a second electrode of said second semiconductor region;

forming a fourth semiconductor region of the first conductivity type at a part of a surface of said third semiconductor region; and forming second trenches having approximately a same depth and same shape in a common direction so that sidewalls of said second trenches contact each of said third semiconductor region and said fourth semiconductor region, forming an insulating film on said sidewall of each of said second trenches, and filling an electrode member in each of said second trenches, thereby forming control electrodes, wherein in the step of forming said first trenches and in the step of forming said second trenches, said control electrodes are arranged in a stripe pattern so as to intersect with said second pillar regions, and a crystal plane orientation appearing in said sidewall of each of said second trenches becomes a crystal plane orientation which is higher in carrier mobility when an impurity is implanted than a crystal plane orientation appearing in said sidewall of each of said first trenches.

* * * * *